(12) United States Patent
Bos et al.

(10) Patent No.: US 9,171,642 B2
(45) Date of Patent: Oct. 27, 2015

(54) SAMPLING NETWORK

(71) Applicant: Google Inc., Mountain View, CA (US)

(72) Inventors: Lynn Bos, Mountain View, CA (US);
Arnold Feldman, San Francisco, CA (US); Shahriar Rabii, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/285,660

(22) Filed: May 23, 2014

(65) Prior Publication Data

US 2014/0253177 A1    Sep. 11, 2014

Related U.S. Application Data

(62) Division of application No. 13/607,960, filed on Sep. 10, 2012, now Pat. No. 8,766,669.

(51) Int. Cl.
*H03K 5/00* (2006.01)
*G11C 27/02* (2006.01)

(52) U.S. Cl.
CPC .............. *G11C 27/028* (2013.01); *G11C 27/02* (2013.01); *G11C 27/024* (2013.01)

(58) Field of Classification Search
CPC .. G11C 27/028; G11C 27/024; G11C 27/026; G11C 27/02
See application file for complete search history.

(56) References Cited

U.S. PATENT DOCUMENTS

| | | | |
|---|---|---|---|
| 7,633,423 B2 | 12/2009 | Cho | |
| 7,724,063 B1 | 5/2010 | Chang et al. | |
| 7,746,260 B1 | 6/2010 | Tu et al. | |
| 2009/0219058 A1 | 9/2009 | Ohba | |
| 2011/0163901 A1 | 7/2011 | Quiquempoix et al. | |
| 2011/0221518 A1 | 9/2011 | Romero | |

*Primary Examiner* — Jung Kim
(74) *Attorney, Agent, or Firm* — Morris & Kamlay LLP

(57) ABSTRACT

A circuit with a sampling network may include a pair of capacitors, where each of the capacitors has a first node and a second node; a first pair of switches communicatively coupling corresponding differential input voltage signals to the first node of each of the capacitors; and a second pair of switches communicatively coupling the second node of each of the capacitors to a common mode voltage source. Corresponding differential output voltage signals at the second node of each of the capacitors may be communicatively coupled using a differential switch. The second pair of switches may be coupled in parallel with the differential switch. A clock signal of the differential switch may be de-asserted prior to de-asserting corresponding clock signals for each of the second pair of switches.

6 Claims, 4 Drawing Sheets

SAMPLING NETWORK

CROSS-REFERENCE TO RELATED APPLICATIONS

This application is a divisional application of U.S. application Ser. No. 13/607,960, filed Sep. 10, 2012, the disclosure of which is incorporated by reference in its entirety.

TECHNICAL FIELD

Aspects of the present application relate generally to the field of integrated circuits. More specifically, certain implementations of the present disclosure relate to an improved sampling network.

BACKGROUND

Sampling networks are widely used in many types of integrated circuits, such as analog-to-digital converters and filters, to convert a continuous time signal to a sampled-and-held signal. However, a key impairment in integrated circuits using sampling networks is distortion over a large input range. The signal distortion is largely due to signal dependent charge injection and kick-back on the driver of the sampling network.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for improved sampling network, substantially as shown in and/or described in connection with at least one of the figures, as set forth more completely in the claims.

These and other advantages, aspects and features of the present disclosure, as well as details of illustrated implementation(s) thereof, will be more fully understood from the following description and drawings.

DETAILED DESCRIPTION

Figure 1:
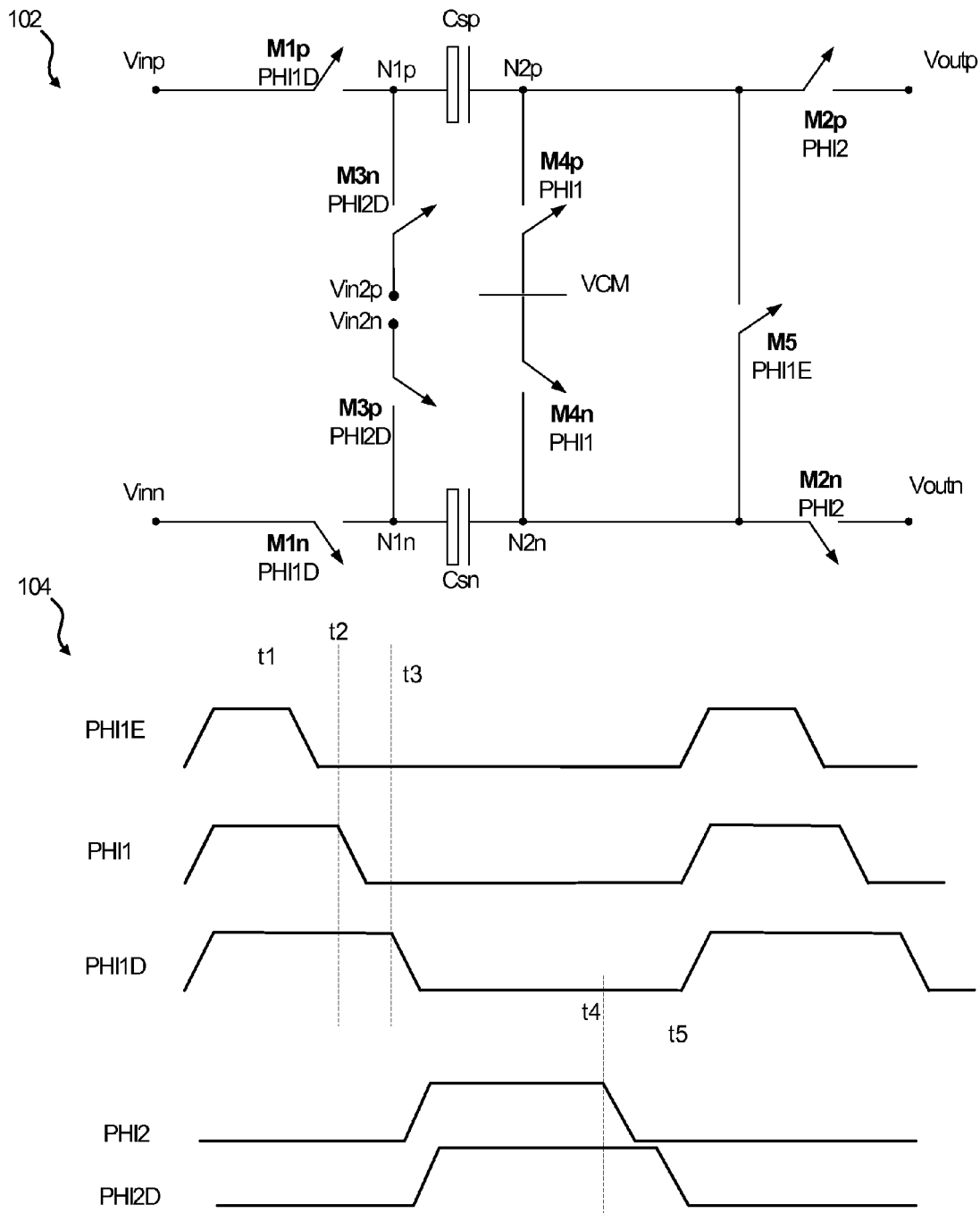
FIG. 1 is a schematic block diagram illustrating an example sampling network with a top-plate switch comprising two single-ended switches and a differential switch, in accordance with an embodiment of the disclosure.

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "e.g.," introduces a list of one or more non-limiting examples, instances, or illustrations.

The most basic sampling network includes a switch and a sampling capacitor. A key impairment of such a sampling network is its distortion, which is set by the absolute value of its time constant and its variation over different input amplitudes. The time constant of the sampling network may be determined by switch on-resistances and the capacitor. The present disclosure relates to an improved sampling network, with reduced signal distortion. More specifically, the sampling networks disclosed herein reduce signal dependent charge injection during the sampling phase by implementing the top-plate switch of the sampling network as a single differential switch along with two switches coupled to a common-mode voltage. In this regard, the on-resistance of the network (as well as the time constant) may be reduced for a minimal amount of channel charge. Additionally, signal distortion within the sampling network is further improved by reusing the top-plate switches in a shorting phase, which eliminates the signal dependent kickback on the sampling network driver.

In accordance with an embodiment of the disclosure, a sampling network may include a pair of capacitors, where each of the capacitors has a first node and a second node. The sampling network may also include a first pair of switches and a second pair of switches. The first pair of switches may communicatively couple corresponding differential input voltage signals to the first node of each of the capacitors. The second pair of switches may communicatively couple the second node of each of the capacitors to a common mode voltage source. The second node of each of the capacitors may be communicatively coupled using a differential switch. The second pair of switches may be coupled in parallel with the differential switch. A clock signal of the differential switch may be de-asserted prior to de-asserting corresponding clock signals for each of the second pair of switches.

Additionally, a method for processing a differential input voltage signal may include coupling a first node of a first capacitor and a first node of a second capacitor to the differential input voltage signal. A second node of the first capacitor and a second node of the second capacitor may be coupled to a common mode voltage source. The second node of the first capacitor may be coupled to the second node of the second capacitor. The differential input voltage signal may be sampled at the first and second capacitors.

FIG. 1 is a schematic block diagram illustrating an example sampling network with a top-plate switch comprising two single-ended switches and a differential switch, in accordance with an embodiment of the disclosure. Referring to FIG. 1, the sampling network 102 may comprise sampling capacitors Csp–Csn, another differential input voltage Vin2n-Vin2p, common mode voltage source VCM, and switches M1p-M1n, M2p-M2n, M3p-M3n, M4p-M4n, and M5.

The switches M1p-M1n, M2p-M2n, M3p-M3n, M4p-M4n, and M5 may comprise one or more MOSFET (or other type) transistors. Alternatively, the switches may be implemented using circuits comprising multiple transistors, as well as other components, such as capacitors.

In the example sampling network 102, the sampling capacitor Csp comprises a first node N1p and a second node N2p. Similarly, the sampling capacitor Csn comprises a first node N1n and a second node N2n. As illustrated in FIG. 1, a differential input voltage signal Vinp–Vinn may be coupled to the first nodes N1p-N1n using the switches M1p-M1n, respectively. The first nodes N1p-N1n of the sampling capacitors Csp–Csn may also be coupled to the other differential input voltage Vin2n-Vin2p using switches M3n-M3p, respectively.

The second nodes N2p-N2n of the sampling capacitors Csp–Csn may be coupled to differential output voltage signals Voutp-Voutn using switches M2p-M2n, respectively. The second nodes N2p-N2n of the sampling capacitors Csp–Csn may also be coupled to the common mode voltage source VCM using switches M4p-M4n, respectively. Additionally, the second node N2p may be coupled to the second node N2n using the switch M5.

The switches M1p-M1n, M2p-M2n, M3p-M3n, M4p-M4n, and M5 may be controlled by clock signals PHI1D, PHI2, PHI2D, PHI1, and PHI1E, respectively. An example timing diagram 104 of clock signals PHI1D, PHI2, PHI2D, PHI1, and PHI1E is illustrated in FIG. 1.

In operation, the sampling network 102 may use bottom-plate sampling to reduce the signal dependent charge injection by opening the top-plate switches (M4p-M4n) connected to the common mode voltage source VCM before opening the bottom-plate switches (M1p-M1n). However, the signal-independent charge in the top-plate switches (M4p-M4n) may see signal dependent on-resistance of the bottom-plate switches (M1p-M1n). In this regard, the resulting charge division will be signal dependent, which may cause signal distortion.

To alleviate signal distortion due to signal-dependent charge injection during sampling, the top-plate switch of the sampling network 102 may be designed smaller to limit the channel charge. More specifically, the top-plate switch of the sampling network 102 may be implemented as a parallel connection of two small switches (M4p-M4n) between each differential signal (Vinp–Vinn) and the common-mode voltage source VCM, as well as a large differential switch (M5) between the two differential signals, as illustrated in the FIG. 1. By using the two small switches (M4p-M4n) and a large differential switch (M5) between the two differential signals, the on-resistance (and the time constant) of the sampling network 102 may be minimized, with a minimal amount of channel charge required.

For purposes of providing an example and to illustrate the benefit of this top-plate switch implementation, it may be assumed that a minimum length switch with a width of 2 μm has an on-resistance of 1 k ohm. It may also be assumed that an on-resistance below 250 ohm is desirable for operation of the sampling network 102. If only two single-ended switches are used as the sampling network top-plate switch (only M4p-M4n), the width of each switch has to be 8 μm to assure the on-resistance is below 250 ohm.

If M4p-M4n and M5 are used instead, the differential switch M5 may be selected to have an on-resistance Rdiff=500 ohm, which means the switch M5 will have a width of 4 μm. The two small switches M4p-M4n may be selected with on-resistance of Rcm1 (resistance of one switch)=Rcm2 (resistance of the second switch)=Rcm=2000 ohm, which means each of the switches M4p and M4n will have a width of 1 μm. The combined on-resistance of the parallel-connected switches (M4p-M4n) and M5 will be as follows:

$$R\text{ parallel}=1/(1/(R\text{diff}/2)+1/(R\text{cm}1))=1/(1/250+1/2000)=222\text{ ohm}.$$

In this regard, if only M4p-M4n are used as the sampling network top-plate switch (i.e., in place of M4p-M4n and M5), the total width of the switches will be 16 μm to assure the on-resistance is below 250 ohm. However, by implementing the sampling network 102 top-plate switch as a pair of two small differential switches (M4p-M4n) in parallel connection with a larger differential switch (M5), the combined on-resistance drops to 222 ohm with a total width of the switches 6 μm. The reduction in the total width of the switches will reduce the amount of channel charge, which in turn reduces signal distortion within the sampling network 102.

An example operation cycle of the sampling network 102 is illustrated by the timing diagram 104 in FIG. 1. While clock signal PHI1E is high (switch M5 is closed), clock signals PHI1 and PHI1D are also high (switches M4p-M4n and M1p-M1n are also closed). In this instant, the differential input signal Vinp and Vinn may be sampled on the sampling capacitors Csp and Csn.

At time t1, when clock signal PHI1E goes low, switch M5 opens. At that moment, the channel charge in M5 can largely flow away to the differential ground of the common-mode voltage source VCM via the still closed switches M4p and M4n. In this regard, an additional improvement may be achieved within the sampling network 102 by opening the differential switch M5 before the two common-mode switches M4p-M4n. In other instances, switches M4p, M4n and M5 may all be clocked by signal PHI1, so that switches M4p and M4n may open at the same time as switch M5. In this case, a benefit of a smaller channel charge for certain on-resistance may be achieved.

At time t2, the clock signal PHI1 may go low, which means switches M4p and M4n are open. At that moment, a small amount of channel charge may still influence and corrupt the signal on the capacitors Csp and Csn. At time t3, the clock signal PHI1D may go low, which means switches M1p and M1n are open. At that moment, the differential voltage signal Vinp and Vinn may be stored on the sampling capacitors Csp and Csn.

After time t3, all switches M5, M4p-M4n and M1p-M1n are open. Clock signals PHI2 and PHI2D may then be asserted high, which means the switches M2p-M2n and M3n-M3p are closed. At that moment, the capacitors are connected to the secondary voltage source Vin2n-Vin2p. Since the differential voltage signal Vinp and Vinn has (up to the moment of asserting PHI2 and PHI2D) been stored on the sampling capacitors Csp and Csn, the capacitors Csp and Csn will now store a voltage signal that is the difference of Vin and Vin2. In other words, the differential output voltage signals Voutp and Voutn will sample the (Vin–Vin2) voltage now stored at the capacitors Csp and Csn. The clock signal Phi2 may be de-asserted at time t4, and the clock signal PHI2D may be de-asserted at a subsequent time t5. In accordance with an embodiment of the disclosure, Voutp and Voutn may be connected to the virtual ground nodes of an operational amplifier with a feedback network.

Figure 2:
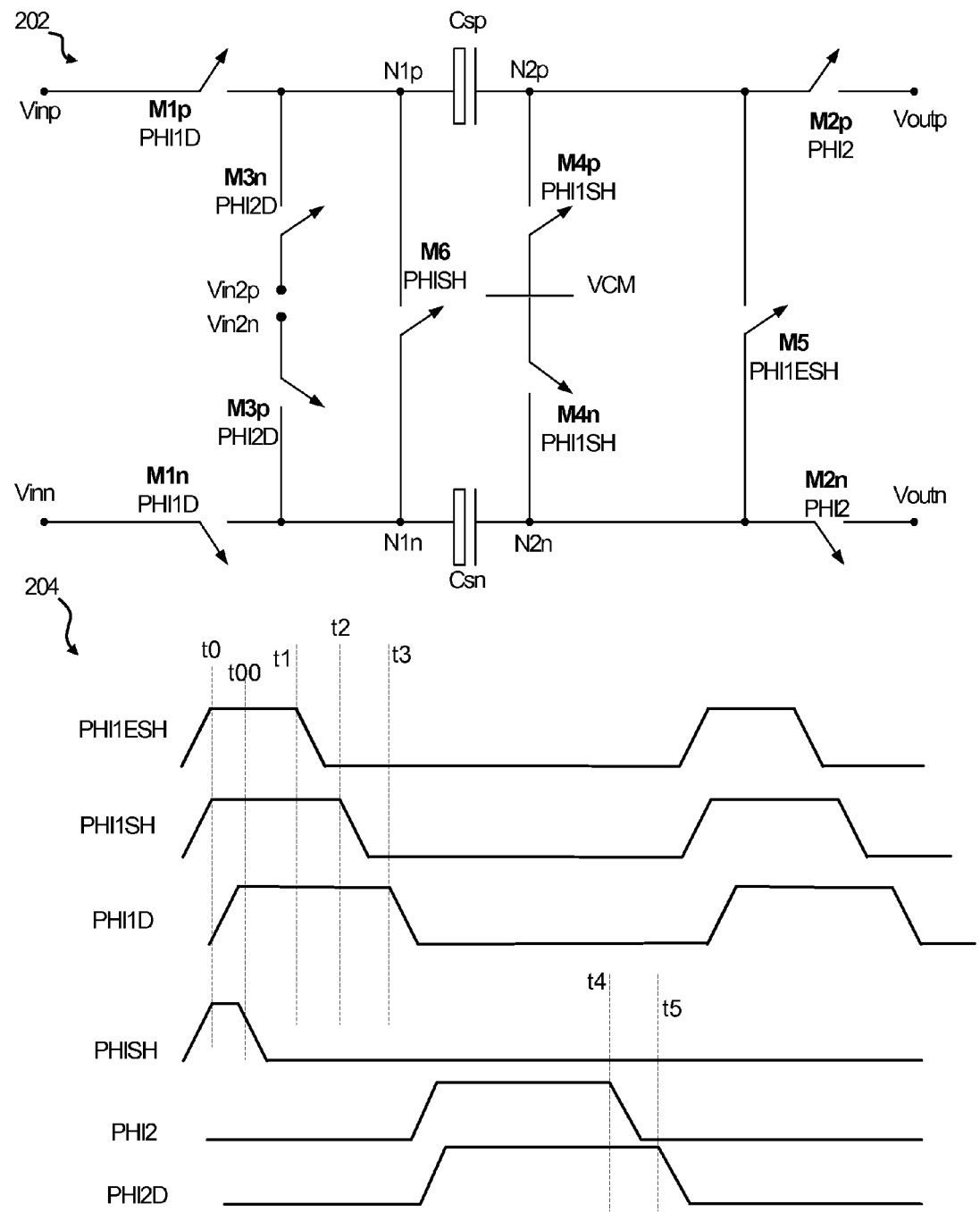
FIG. 2 is a schematic block diagram illustrating an example sampling network with a shorting phase, in accordance with an embodiment of the disclosure.

FIG. 2 is a schematic block diagram illustrating an example sampling network with a shorting phase, in accordance with an embodiment of the disclosure. Referring to FIG. 2, the sampling network 202 may comprise sampling capacitors Csp–Csn, differential voltage source Vin2n-Vin2p, common mode voltage source VCM, and switches M1p-M1n, M2p-M2n, M3p-M3n, M4p-M4n, M5, and M6.

The switches M1p-M1n, M2p-M2n, M3p-M3n, M4p-M4n, M5, and M6 may comprise one or more MOSFET (or other type) transistors. Alternatively, the switches may be implemented using circuits comprising multiple transistors, as well as other components, such as capacitors.

In the example sampling network 202, the sampling capacitor Csp comprises a first node N1p and a second node N2p. Similarly, the sampling capacitor Csn comprises a first node N1n and a second node N2n. As illustrated in FIG. 2, a differential input voltage signal Vinp–Vinn may be coupled to the first nodes N1p-N1n using the switches M1p-M1n, respectively. The first nodes N1p-N1n of the sampling capacitors Csp-Csn may also be coupled to the differential voltage source Vin2n-Vin2p using switches M3n-M3p, respectively. Additionally, the first nodes N1p and N1n may be coupled via the switch M6.

The second nodes N2p-N2n of the sampling capacitors Csp-Csn may be coupled to differential output voltage signals Voutp-Voutn using switches M2p-M2n, respectively. The second nodes N2p-N2n of the sampling capacitors Csp-Csn may also be coupled to the common mode voltage source VCM using switches M4p-M4n, respectively. Additionally, the second node N2p may be coupled to the second node N2n using the switch M5.

The switches M1p-M1n, M2p-M2n, M3p-M3n, M4p-M4n, M5, and M6 may be controlled by clock signals PHI1D, PHI2, PHI2D, PHI1SH, PHI1ESH, and PHISH, respectively. An example timing diagram 204 of clock signals PHI1D, PHI2, PHI2D, PHI1SH, PHI1ESH, and PHISH is illustrated in FIG. 2.

A limiting factor for signal distortion within the sampling network 202 may be the signal-dependent kickback on the sampling network driver that performs a subtraction operation (e.g., as performed in a successive approximation Analog-to-Digital Converter, a pipeline ADC, a switched-capacitor filter, or a sigma-delta ADC). More specifically, the remaining charge on the sampling capacitors Csp–Csn from the clock phase of signal PHI2 may influence the kickback on the continuous-time driver of the sampling network. Therefore, the sampling network 202 may be further improved by introducing an extra shorting phase between clock signals PHI2 and PHI1 (as seen in timing diagram 204) for resetting the charge right before the sampling phase during the high time of PHI1D. The charge resetting may be accomplished by introducing an additional switch M6 and clock signal PHISH to control the shorting operations of switch M6. Additionally, the top-plate switches (M4p-M4n and M5) need to be closed during the successive shorting and sampling phase, as shown in the timing diagram 204 in FIG. 2.

An example operation cycle of the sampling network 202 is illustrated by the timing diagram 204 in FIG. 2. While clock signals PHI2 and PHI2D are high (switches M2p-M2n and M3n-M3p are closed), the differential voltages Vin2n and Vin2p are stored on to the sampling capacitors Csn and Csp.

At time t0 (and prior to time t00), when clock signal PHISH is high, clock signals PHI1ESH and PHI1SH are also high (meaning the switches M4p-M4n, M5 and M6 are closed). In this regard, by shorting the top-plate switches (M4p-M4n and M5) as well as switch M6, the sampling capacitors Csp and Csn may be reset.

At time t00, clock signal PHISH is de-asserted (switch M6 is open). While clock signal PHI1ESH is high (switch M5 is closed), clock signals PHI1SH and PHI1D may also be high, which means the switches M4p-M4n and M1p-M1n are also closed. In this instant, the differential input signal Vinp and Vinn may be sampled on the sampling capacitors Csp and Csn.

At time t1, when clock signal PHI1ESH goes low, switch M5 opens. At that moment, the channel charge in M5 can largely flow away to the differential ground of the common-mode voltage source VCM via the still closed switches M4p and M4n. In this regard, an additional improvement may be achieved within the sampling network 102 by opening the differential switch M5 before the two common-mode switches M4p-M4n. In other instances, switches M4p, M4n and M5 may all be clocked by signal PHI1SH, so that switches M4p and M4n may open at the same time as switch M5. In this case, a benefit of a smaller channel charge for certain on-resistance may be achieved.

At time t2, the clock signal PHI1SH may go low, which means switches M4p and M4n are open. At that moment, a small amount of channel charge may still influence and corrupt the signal on the capacitors Csp and Csn. At time t3, the clock signal PHI1D may go low, which means switches M1p and M1n are open. At that moment, the differential voltage signal Vinp and Vinn may be stored on the sampling capacitors Csp and Csn.

After time t3, all switches M5, M4p-M4n and M1p-M1n are open. Clock signals PHI2 and PHI2D may then be asserted high, which means the switches M2p-M2n and M3n-M3p are closed. At that moment, the capacitors are connected to the secondary voltage source Vin2n-Vin2p. Since the differential voltage signal Vinp and Vinn has (up to the moment of asserting PHI2 and PHI2D) been stored on the sampling capacitors Csp and Csn, the capacitors Csp and Csn will now store a voltage signal that is the difference of Vin and Vin2. In other words, the differential output voltage signals Voutp and Voutn will sample the (Vin-Vin2) voltage now stored at the capacitors Csp and Csn. The clock signal Phi2 may be de-asserted at time t4, and the clock signal PHI2D may be de-asserted at a subsequent time t5.

In accordance with an embodiment of the disclosure, Voutp and Voutn may be connected to the virtual ground nodes of an operational amplifier with a feedback network.

Figure 3:
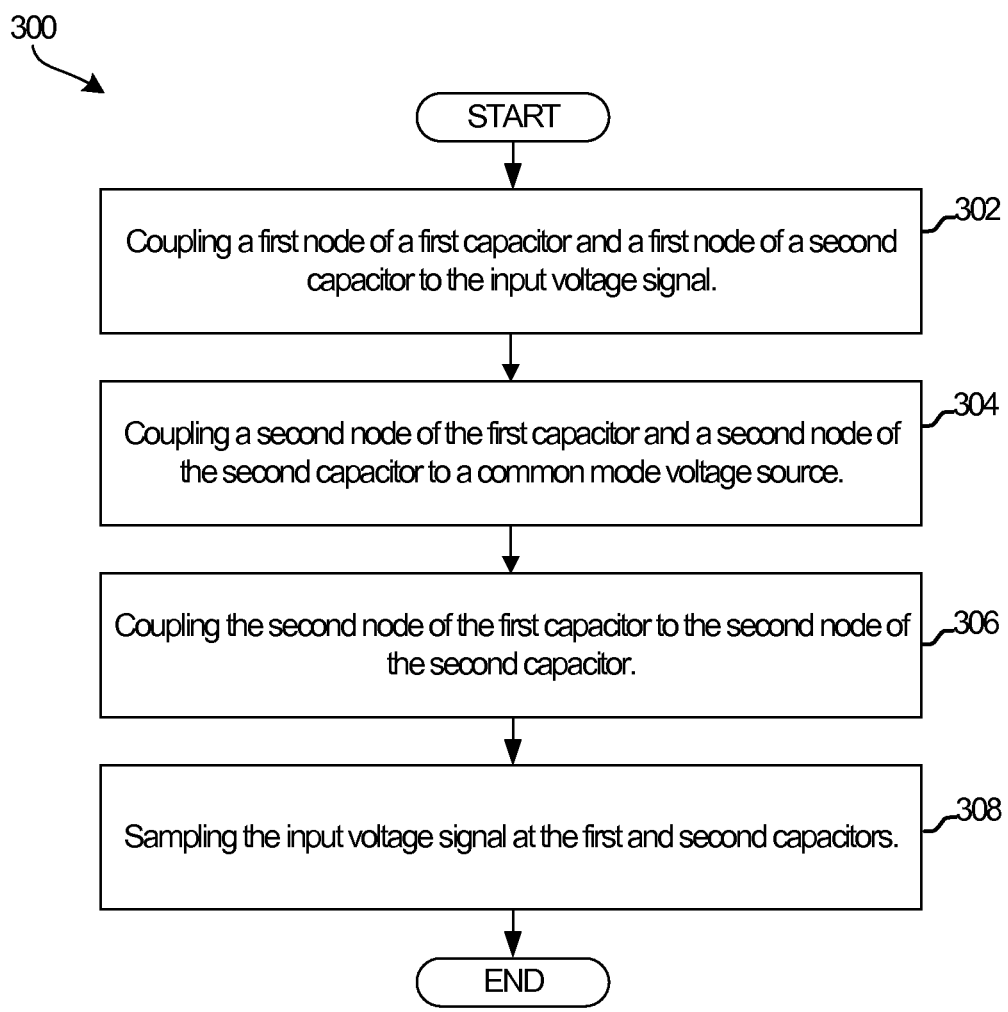
FIG. 3 is a flow chart illustrating example steps of a method for processing a differential input voltage signal by the sampling network of FIG. 1, in accordance with an embodiment of the disclosure.

FIG. 3 is a flow chart illustrating example steps of a method for processing a differential input voltage signal by the sampling network of FIG. 1, in accordance with an embodiment of the disclosure. Referring to FIGS. 1 and 3, the example method 300 may start at 302, when a first node (e.g., N1p) of a first capacitor (e.g., Csp) and a first node (e.g., N1n) of a second capacitor (e.g., Csn) may be coupled to the differential input voltage signal (e.g., Vinp–Vinn). At 304, a second node (e.g., N2p) of the first capacitor (Csp) and a second node (e.g., N2n) of the second capacitor (Csn) may be coupled to a common mode voltage source (e.g., VCM). At 306, the second node (N2p) of the first capacitor (Csp) may be coupled to the second node (N2n) of the second capacitor (Csn). At 308, the differential input voltage signal (Vinp–Vinn) may be sampled at the first and second capacitors (Csp–Csn).

Figure 4:
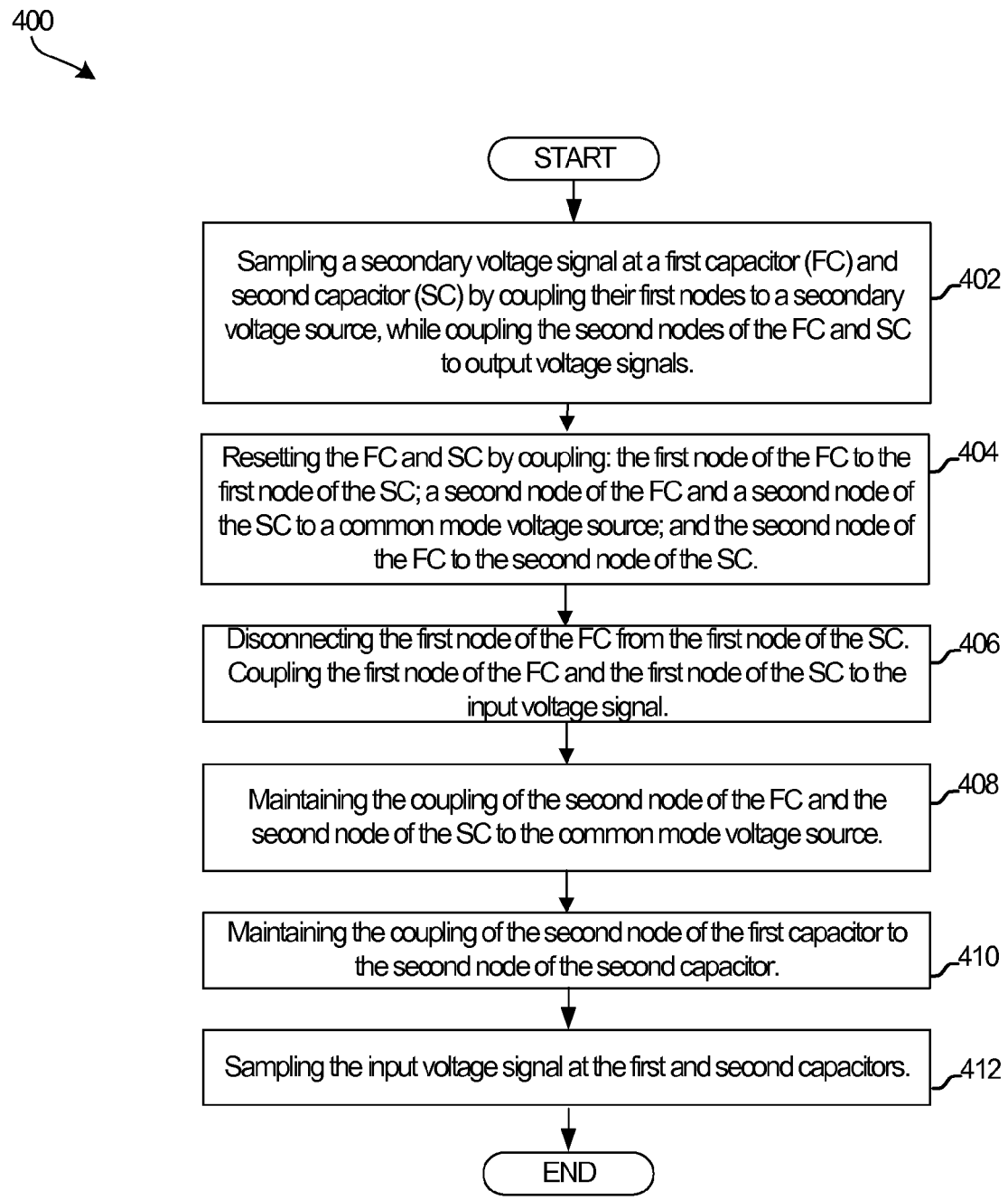
FIG. 4 is a flow chart illustrating example steps of a method for processing a differential input voltage signal by the sampling network of FIG. 2, in accordance with an embodiment of the disclosure.

FIG. 4 is a flow chart illustrating example steps of a method for processing a differential input voltage signal by the sampling network of FIG. 2, in accordance with an embodiment of the disclosure. Referring to FIGS. 2 and 4, the example method 400 may start at 402, when a secondary differential voltage signal (e.g., Vinp2–Vinn2) may be sampled at a first capacitor (FC) (e.g., Csp) and second capacitors (SC) (e.g., Csn) by coupling their first nodes (e.g., N1p, N1n) to a secondary differential voltage source (e.g., Vin2n-Vin2p), while coupling the second nodes (e.g., N2p, N2n) of the FC and SC to output voltage signals (e.g., Voutp-Voutn).

At 404, the FC (Csp) and SC (Csn) may be reset by coupling the first node (N1p) of the FC to the first node (N1n) of the SC, coupling the second node (N2p) of the FC and the second node (N2n) of the SC to a common mode voltage source (e.g., VCM), and coupling the second node (N2p) of the FC to the second node (N2n) of the SC. At 406, the first node (N1p) of the FC may be disconnected from the first node (N1n) of the SC. The first node (N1p) of the FC and the first node (N1n) of the SC may be coupled to the differential input voltage signal (Vinp–Vinn).

At 408, the coupling of the second node (N2p) of the FC and the second node (N2n) of the SC to the common mode voltage source (VCM) may be maintained. At 410, the coupling of the second node (N2p) of the first capacitor (Csp) to the second node (N2n) of the second capacitor (Csn) may be maintained. At 412, the differential input voltage signal (Vinp–Vinn) may be sampled at the first and second capacitors (Csp–Csn).

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method for processing a differential input voltage signal, comprising:
   coupling a first node of a first capacitor and a first node of a second capacitor to the differential input voltage signal;
   coupling a second node of the first capacitor and a second node of the second capacitor to a common mode voltage source;
   coupling the second node of the first capacitor to the second node of the second capacitor;
   sampling the differential input voltage signal at the first and second capacitors; and
   de-coupling the second node of the first capacitor from the second node of the second capacitor prior to de-coupling the second node of the first capacitor from the common mode voltage source.

2. The method according to claim 1, comprising:
   resetting the first capacitor and the second capacitor prior to the sampling by:
      coupling the first node of the first capacitor to the first node of the second capacitor;
      coupling the second node of the first capacitor and the second node of the second capacitor to the common mode voltage source; and
      coupling the second node of the first capacitor to the second node of the second capacitor.

3. The method according to claim 1, comprising:
   de-coupling the second node of the first capacitor and the second node of the second capacitor from the common mode voltage source.

4. The method according to claim 3, comprising:
   de-coupling the first node of the first capacitor and the first node of the second capacitor from the differential input voltage signal.

5. The method according to claim 4, comprising:
   coupling the first node of the first capacitor and the first node of the second capacitor to another differential input voltage; and
   coupling the second node of the first capacitor and the second node of the second capacitor to differential output voltage signals.

6. The method according to claim 5, comprising:
   sampling the differential output voltage signals, wherein voltage of the differential output voltage signals equals the difference of voltages provided by the differential input voltage signal and another differential input voltage.

* * * * *